(12) United States Patent
Hakozaki

(10) Patent No.: US 6,178,094 B1
(45) Date of Patent: Jan. 23, 2001

(54) DEVICE FOR MOUNTING BOARDS

(75) Inventor: Hirotoshi Hakozaki, Tokyo (JP)

(73) Assignee: Mitsubishi Denki Kabushiki Kaisha, Tokyo (JP)

( * ) Notice: Under 35 U.S.C. 154(b), the term of this patent shall be extended for 0 days.

(21) Appl. No.: 09/233,120

(22) Filed: Jan. 19, 1999

(30) Foreign Application Priority Data

Jul. 27, 1998 (JP) ................................................. 10-211164

(51) Int. Cl.⁷ ...................................................... H05K 7/14
(52) U.S. Cl. .......................... 361/796; 361/752; 361/756; 361/801; 174/49; 16/95 R
(58) Field of Search ..................... 361/752, 753, 361/754, 756, 759, 796, 801, 802; 174/49; 16/95 R, 108

(56) References Cited

U.S. PATENT DOCUMENTS

| | | | |
|---|---|---|---|
| 4,558,396 | * 12/1985 | Kawabata et al. | ..................... 361/759 |
| 4,706,819 | * 11/1987 | Elliott | ..................... 211/41 |
| 5,206,972 | * 5/1993 | Nudelmont et al. | .................. 16/95 R |
| 5,594,627 | * 1/1997 | Le | ........................ 361/796 |

FOREIGN PATENT DOCUMENTS 8-177518   7/1996  (JP) .

* cited by examiner

Primary Examiner—Jeffrey Gaffin
Assistant Examiner—Tuan Dinh
(74) Attorney, Agent, or Firm—Sughrue, Mion, Zinn, Macpeak & Seas, PLLC

(57) ABSTRACT

A device for mounting boards, which requires decreased positioning precision for inserting the boards, offering improved operation efficiency and reliability without driving up the cost. The device for mounting boards includes a case body 1 having board guide grooves 3 formed in the inner surface thereof, and a case closure 7 secured to an end of said case body, in order to position and secure the circuit boards in a housing constituted by the case body and the case closure, wherein the board guide grooves have a uniform width w slightly larger than the thickness of the circuit boards and have tapered portions 3a of which the width is broadened toward an end of the case body opposed to the case closure, and the case closure has securing pawls 8 which produce elastic force in a direction to be fitted to the case body, and board-holding portions 9 for positioning and holding the ends of the circuit boards. The circuit boards are smoothly and correctly inserted in the board-guide grooves through the tapered portions.

20 Claims, 5 Drawing Sheets

DEVICE FOR MOUNTING BOARDS

BACKGROUND OF THE INVENTION

1. Field of the Invention

The present invention relates to a device for mounting boards, that is used for accommodating circuit boards mounting electronic parts in a housing. More particularly, the invention relates to a device for mounting boards making it possible to decrease the cost and to improve the operation efficiency and reliability.

2. Prior Art

In an electronic control unit for controlling the injection of fuel or for controlling the ignition of, for example, an automotive engine, the circuit board has heretofore been accommodated in a housing in order to protect the electronic parts mounted on the circuit board from the external environment.

For mounting the circuit boards in a casing, furthermore, various board-mounting devices have been proposed for positioning and securing the circuit boards from the standpoint of enhancing the productivity by decreasing the number of steps without using separate securing means such as screws or the like.

FIG. 8 is a side sectional view illustrating a conventional board-mounting device disclosed in Japanese Unexamined Patent Publication No. 177518/1996.

In FIG. 8, a case body 20 constituting a housing includes a back surface plate 20a positioned at the deepest end and side surface plates 20b positioned on both sides.

A board-securing groove 23 of a V-shape in cross section is formed in the inner surface of the back surface plate 20a. Furthermore, a board guide groove 25 of a uniform width is formed in the inner surfaces of the two side surface plates 20b so as to be continuous to the board-securing groove 23.

The case body 20 has a case closure 26 coupled to an open end. A board-securing groove 27 of the same shape as the board-securing groove 23 is formed in the surface of the case closure 26. The board-securing groove 27 is formed to be continuous to the board guide groove 25.

The case closure 26 is secured to the case body 20 via screws 29.

A circuit board 30 is held and secured between the board guide grooves 23 and 27. Both ends of the circuit board 30 are held by the board guide grooves 23 and 27 of a V-shape in the direction of thickness of the circuit board 30, and are positioned and secured.

A plurality of electronic parts 32 are mounted on the circuit board 30 to realize the required functions of the control unit.

The case closure 26 is provided with a connector 33 for connection to an external unit, and a plurality of lead wires 35 of the connector 33 are connected to a pattern on the circuit board 30.

When the case body 20 and the case closure 26 are coupled together, the circuit board 30 is positioned by the guide groove 25 and is secured by the board-securing grooves 23 and 27.

This makes it possible to position and secure the circuit board 30 in the case body 20 and in the case closure 26 without using any separate securing means such as screws.

When the circuit board 30 is positioned and secured between the board guide grooves 23 and 27 as shown in FIG. 8, however, the circuit board 30 must be correctly positioned and inserted in the board guide groove 25 which is relatively narrow having a width equal to the thickness of the circuit board 30, so that the circuit board 30 can be inserted in the case body 20.

Furthermore, the board guide groove 25 is guiding the circuit board 30 in the direction of its thickness only. Therefore, the circuit board 30 may often be incorrectly inserted such as front surface back or front side back.

In order to prevent the circuit board 30 from being erroneously inserted, a special inspection facility is required. In order to inspect modern electronic control units having complex constitution, in particular, a special inspection facility is required such as an image processor for checking.

Moreover, to insert plural pieces of circuit boards in an overlapped manner in the housing, special parts or mechanisms are necessary for supporting and securing the individual circuit boards.

According to the conventional board-mounting device as described above, the circuit board is inserted in the case body 20 via the board guide groove 25, and both ends of the circuit board 30 are held by the board-securing grooves 23 and 27. Therefore, highly precise positioning operation is required impairing the operation efficiency.

Besides, it is not allowed to prevent the circuit board 30 from being erroneously inserted. Therefore, the reliability is low, and a new mechanism is required for preventing the erroneous insertion, resulting in an increase in the cost.

Besides, when plural pieces of circuit boards are to be inserted in an overlapped manner in the case body 20, special parts are needed for supporting and securing the individual circuit boards, resulting in an increase in the cost.

SUMMARY OF THE INVENTION

The present invention was accomplished in order to solve the above-mentioned problems, and its object is to provide a device for mounting boards capable of enhancing the operation efficiency and reliability without driving up the cost.

A device for mounting boards according to the present invention comprises a case body having board guide grooves formed in the inner surface thereof, and a case closure secured to an end of said case body, in order to position and secure the circuit boards in a housing constituted by said case body and said case closure, wherein said board guide grooves have a uniform width slightly larger than the thickness of said circuit boards and have tapered portions of which the width is broadened toward an end of said case body opposed to said case closure, and said case closure has securing pawls which produce elastic force in a direction to be fitted to said case body, and board-holding portions for positioning and holding the ends of said circuit boards.

In the device for mounting boards according to the present invention, the board-guide grooves are formed at positions asymmetrical in the up-and-down direction of the case body which is the direction of thickness of the circuit boards.

In the device for mounting boards according to the present invention, the case body has a board-positioning member formed on the inner surface of a back surface plate positioned on the side opposite to the side on where the case closure is mounted so as to intersect said board guide grooves, and said circuit board has an engaging portion at a front end thereof in the direction in which it is inserted in said case body so as to engage with said board-positioning member.

In the device for mounting boards according to the present invention, the board-positioning member is disposed at a position asymmetrical in the right-and-left direction of the case body which is the direction of width of the circuit board.

In the device for mounting boards according to the present invention, the case body has resilient protuberances formed on the inner surfaces of the side plates arranged in parallel with the direction of insertion of said circuit board so as to intersect said board guide grooves, and said circuit board has recessed portions to engage with said resilient protuberances.

In the device for mounting boards according to the present invention, the resilient protuberances have tapered portions which enable the circuit board to move in the direction of insertion and engaging portions which prevent the circuit board from moving in a direction in which it is taken out, and the recessed portions in the circuit board have a shape complementary to said resilient protuberances.

In the device for mounting boards according to the present invention, the resilient protuberances are formed on the side plates on both sides of the case body and are arranged at positions asymmetrical in the back-and-forth direction of said case body in which said circuit board is inserted.

In the device for mounting boards according to the present invention, the circuit board comprises plural pieces of circuit boards which are arranged in the form of layers in a direction in which they are overlapped.

In the device for mounting boards according to the present invention, the plural pieces of circuit boards are arranged being separated away from each other, and space-holding members are provided in space among the circuit boards.

In the device for mounting boards according to the present invention, the space-holding member is provided nearly at the center at the front end of each circuit board.

DESCRIPTION OF THE PREFERRED EMBODIMENTS

Embodiment 1

An embodiment 1 of the present invention will now be described with reference to the drawings.

Figure 1:
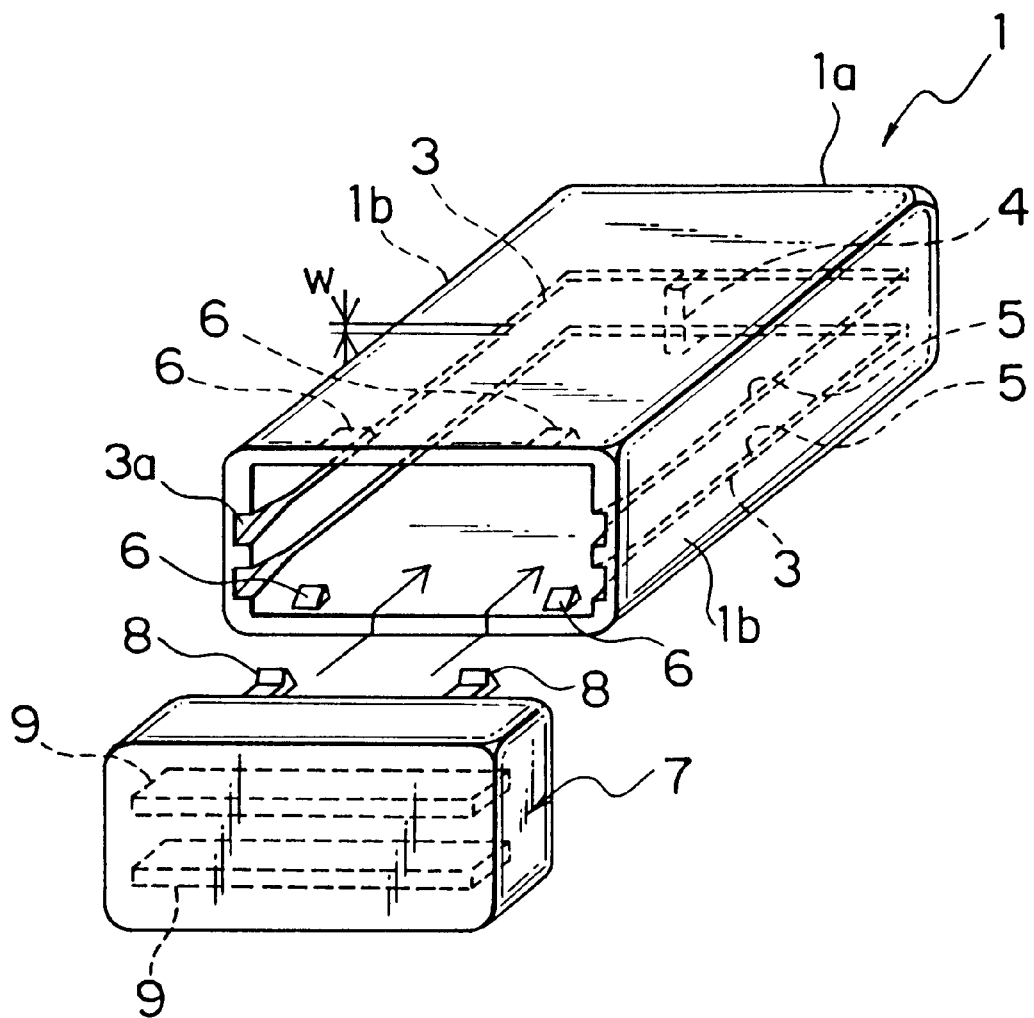
FIG. 1 is a perspective view illustrating, in a disassembled manner, a housing according to an embodiment 1 of the present invention.
Figure 2:
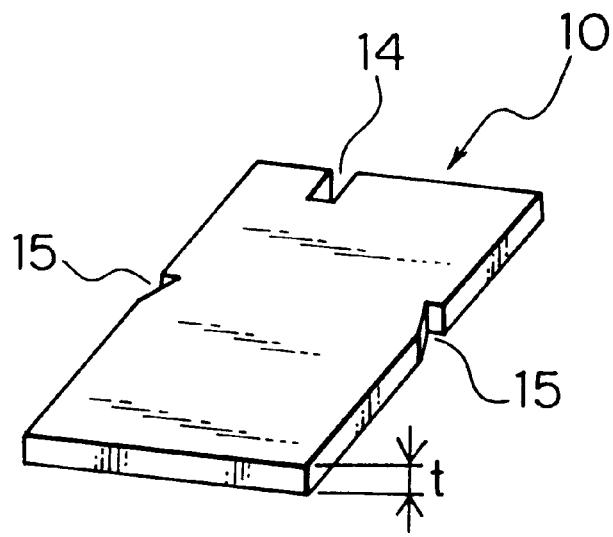
FIG. 2 is a perspective view illustrating a circuit board according to the embodiment 1 of the present invention.

FIG. 1 is a perspective view illustrating, in a disassembled manner, a housing according to an embodiment 1 of the present invention, and FIG. 2 is a perspective view illustrating a circuit board 10 according to the embodiment 1 of the present invention.

Figure 3:
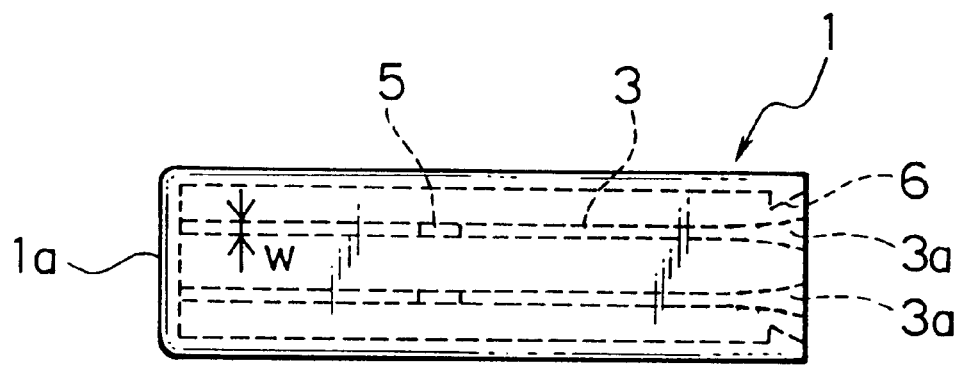
FIG. 3 is a side view illustrating a case body according to the embodiment 1 of the present invention.
Figure 4:
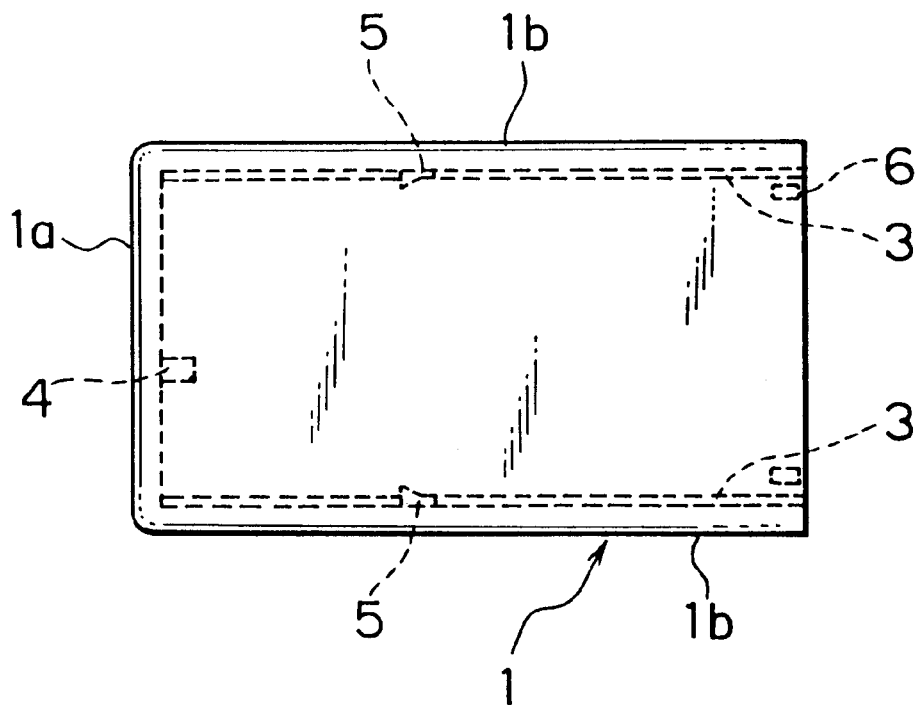
FIG. 4 is a plan view illustrating the case body according to the embodiment 1 of the present invention.
Figure 5:
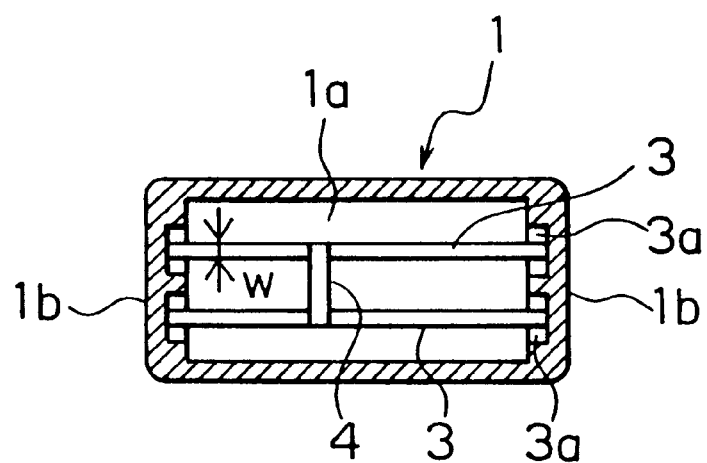
FIG. 5 is a sectional view illustrating the case body according to the embodiment 1 of the present invention.
Figure 6:
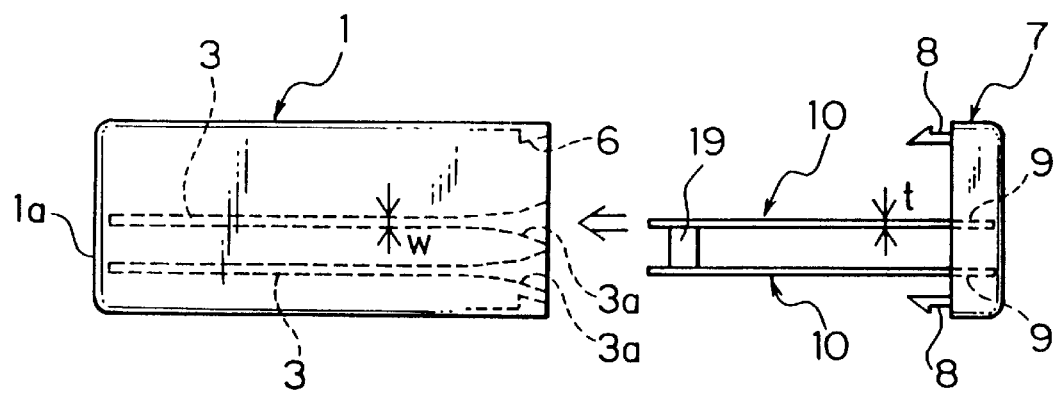
FIG. 6 is a side view illustrating, in a disassembled manner, a correctly assembled state according to the embodiment 1 of the present invention.
Figure 7:
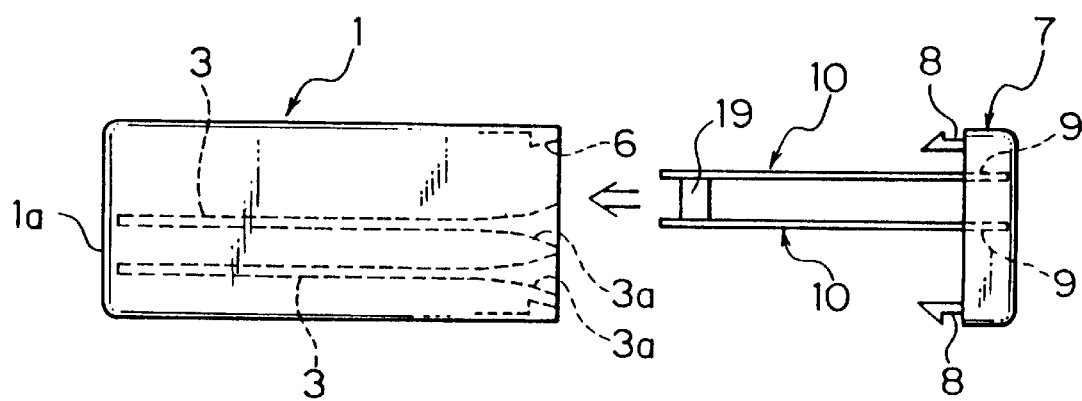
FIG. 7 is a side view illustrating, in a disassembled manner, an incorrectly assembled state according to the embodiment 1 of the present invention.

FIGS. 3 to 5 are a side view, a plan view and a sectional view illustrating a case body according to the embodiment 1 of the present invention, and FIGS. 6 and 7 are side views illustrating, in a disassembled manner, the assembled state according to the embodiment 1 of the present invention. Here, FIG. 6 illustrates a state where the device is correctly assembled, and FIG. 7 illustrates a state where the device is incorrectly assembled.

In FIG. 1, the case body 1 constitutes a housing having a case closure 7 secured to one end thereof, and accommodates circuit boards 10 (see FIG. 2) in any number (for example, two pieces in FIG. 6) and positions and secures them.

In the drawings, the case body 1 comprises a back surface plate 1a located on the side opposite to the side where the case closure 7 is mounted, i.e., at the deepest position in a direction in which the circuit boards 10 are inserted, and side plates 1b arranged on both sides in parallel with the direction in which the circuit boards 10 are inserted. Board guide grooves 3 are formed in the inner surfaces of the back surface plate 1a and of the side surface plates 1b.

Each board guide groove 3 has a uniform width w which is slightly greater than the thickness t of the circuit board 10, and has tapered portions 3a which are broadened toward the one end of the case body 1 facing the case closure 7.

For example, when the thickness t of the circuit board 10 is 1.6 mm, the width w of the board guide groove 3 is set to be about 1.7 mm. A maximum width of the tapered portions 3a is set to be about 3 to 7 mm though it may vary depending upon the case body 1 and the number of the circuit boards 10.

The board guide grooves 3 are arranged at asymmetrical positions in the up-and-down direction of the case body 1 which is the direction of thickness of the circuit board 10. Illustrated here is the case where the board guide grooves 3 are wholly arranged closer to the lower side of the case body 1.

The case body 1 has a board-positioning member 4 formed on the inner surface of the back surface plate 1a to protrude and to intersect the board guide grooves 3. The board-positioning member 4 is disposed at a position asymmetrical in the right-and-left direction of the case body 1 which is the direction of width of the circuit board 10. Illustrated here is the case where the board-positioning member 4 is disposed on the left side of the case body 1.

The case body 1 has resilient protuberances 5 formed on the inner surfaces of the side surface plates 1b so as to intersect the board guide grooves 3. In this case, the resilient protuberances 5 are formed on the side surface plates 1b on both sides of the case body 1.

Referring to FIG. 4, each resilient protuberance has a tapered portion (tilted surface portion) which permits the circuit board 10 to be moved in a direction in which it is inserted and an engaging portion (linear portion) which blocks the circuit board from moving in a direction in which it is taken out.

The resilient protuberances 5 may be formed at positions asymmetrical in the back-and-forth direction of the case body 1 in which the circuit board 10 is inserted.

Moreover, the case body 1 has fitting portions 6 that fit to the case closure 7 to secure it.

Referring to FIGS. 1 and 6, the case closure 7 has securing pawls 8 that produce elastic force in a direction to fit to the fitting portions 6 of the case body 1, and board-holding portions 9 for positioning and holding the ends of the circuit boards 10.

The board-holding portions 9 are, for example, grooves formed in a resilient member, and may be so constituted as to hold the ends of the circuit boards 10.

Figure 8:
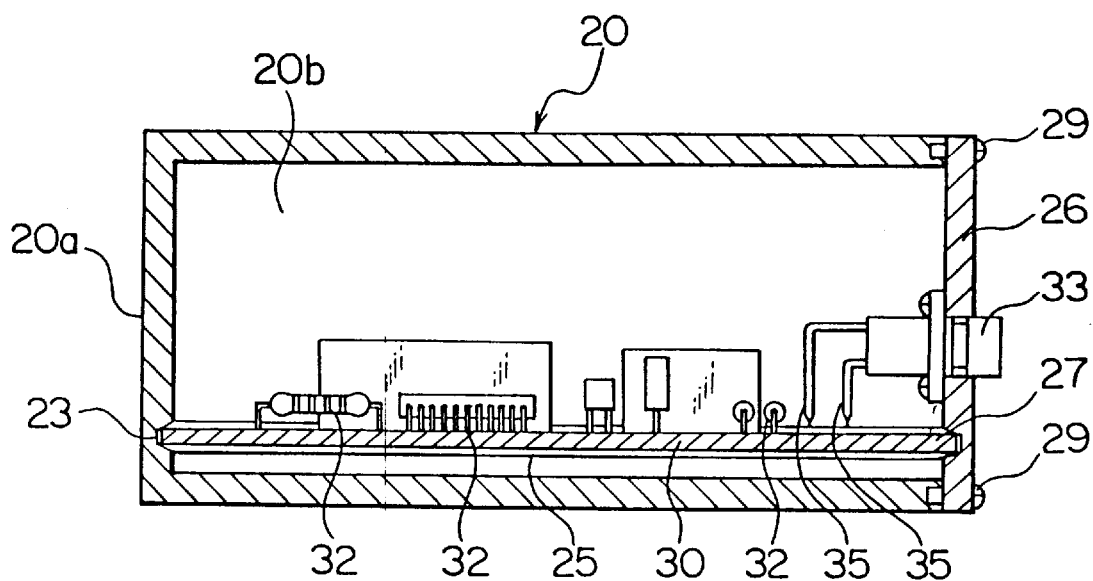
FIG. 8 is a sectional view illustrating a conventional substrate-mounting device.

Referring to FIG. 2, the circuit board 10 has an engaging portion 14 at an end thereof in the direction in which it is inserted in the case body 1 so as to engage with the board-positioning member 4. The circuit board 10 has recessed portions 15 formed in the side ends thereof so as to engage with the resilient protuberances 5. The recessed portions 15 have a shape complementary to the resilient protuberances 5. Though not diagramed here, on the circuit board 10 are mounted electronic parts similar to the one shown in FIG. 8.

As shown in FIG. 6, furthermore, when plural pieces of circuit boards 10 are arranged spaced apart from each other and are inserted in the case body 1 integrally together, space between the circuit boards 10 is provided with a spacer 19 which is a space-holding member for holding relative positions of the circuit boards 10.

When the circuit boards 10 are mounted on the board-holding portions 9 of the case closure 7, the spacers 19 are adhered to the opposing surfaces of the circuit boards by using a double-sided tape or are fitted thereto or are screwed thereto.

In this case, the spacers 19 are provided nearly at the centers of the ends of the circuit boards 10.

Next, described below with reference to FIGS. 6 and 7 is how to assemble the embodiment 1 of the present invention shown in FIGS. 1 to 5.

First, a given number of pieces of circuit boards 10 are positioned and held by the board-holding portions 9 of the case closure 7.

In this case, plural pieces of circuit boards 10 are accommodated in the housing, mounted on the case closure 7 in the form of layers in a direction in which they are overlapped, and are integrally inserted in the case body 1.

Here, the tapered portions 3a of the board guide groove 3 become narrow smoothly from the front (opening) toward the back in the side surfaces of the case body 1. Therefore, the circuit boards 10 can be easily and correctly inserted in the board guide grooves 3 at the back of the case body 1 without requiring highly precise positioning operation.

That is, the circuit boards 10 that are inserted in a properly arranged state as shown in FIG. 6, are smoothly incorporated in the case body 1 together with the case closure 7.

The case body 1 and the case closure 7 are secured together via the fitting portions 6 and securing pawls 8.

Owing to the engagement of the board-positioning member 4 and the engaging portion 14, the circuit board 10 is positioned in the right-and-left direction relative to the case body 1. Owing to the engagement of the resilient protuberances 5 and the recessed portions 15, furthermore, the circuit board 10 is positioned in the direction of insertion relative to the case body 1 and is prevented from escaping.

Referring to FIG. 7, on the other hand, the circuit boards 10 that are erroneously inserted upside down, are not allowed to be inserted since the board guide grooves 3 are asymmetrically arranged in the up-and-down direction. Thus, the circuit boards 10 are prevented from being erroneously inserted.

Despite the board guide grooves 3 are in match with the circuit boards 10 which are erroneously inserted as shown in FIG. 7, the resilient protuberances 5 are not in agreement with the recessed portions 15. The case body 1 and the case closure 7 are not finally fitted to each other. Accordingly, the erroneously inserted state can be easily learned by simply checking the appearance.

Even when the products containing the circuit boards in an erroneous manner flow through the steps of production, the case body 1 and the case closure 7 are not fitted together. Therefore, such products can be determined by simply checking the appearance.

Therefore, no special inspection facility is required, such as image processor; i.e., the inspection facility can be simplified and the cost can be decreased.

The circuit boards 10 are assembled into the board-holding portions 9 of the case closure 7 and are, then, inserted in the case body 1 in the final step of assembling. In this case, since the circuit boards 10 have been secured to the case body 1 via the case closure 7, no screw is needed for securing the circuit boards 10 to the case body 1.

Therefore, the number of parts can be decreased, and the cost can be decreased.

Moreover, no screw-fastening step is required for securing the case body 1 and the case closure 7 together, making it possible to decrease the number of steps of operation and to decrease the time for assembling.

When a given number of pieces of circuit boards 10 are to be inserted being overlapped one upon the other, a corresponding number of board guide grooves 3 are formed in the case body 1, and spacers 19 are interposed, thereby to firmly support the circuit boards 10. This eliminates complex parts and mechanisms for firmly supporting the circuit boards.

As the space-holding members for plural pieces of circuit boards 10, inter-board connectors can be used instead of the spacers 19. Besides, inter-board connectors can be used in combination with the spacers 19.

Finally, the circuit boards 10 are mounted by finally combining the case body 1 and the case closure 7 together. Therefore, a free design can be conducted on the outside of the case closure 7 owing to its structure.

Embodiment 2

In the above-mentioned embodiment 1, the board guide grooves 3, board-positioning member 4 and resilient protuberances 5 are arranged in an off-set manner to prevent erroneous insertion. However, only any one of them may be offset.

Embodiment 3

In the above-mentioned embodiment 1, the securing pawls 8 were provided on the side of the case closure 7 so that the case body 1 and the case closure 7 were fitted to each other. However, the securing pawls may be provided on the side of the case body 1.

Embodiment 4

In the above-mentioned embodiment 1, the board-positioning member 4 was formed in a protruding manner on the inner surface of the case body 1. The board-positioning member, however, may be formed in a recessed manner. In this case, the engaging portion 14 of the circuit board 10 is formed in a protruded manner.

What is claimed is:

1. A device for mounting circuit boards comprising:
a case body having board guide grooves formed in an inner surface thereof; and
a case closure secured to an end of said case body, in order to position and secure the circuit boards in a housing constituted by said case body and said case closure;
wherein said board guide grooves have a uniform width slightly larger than a thickness of said circuit boards and tapered portions at one end with a width of each tapered portion expanding in a direction towards an end of said case body which opposes said case closure, opposite to an insertion direction of said respective circuit board; and
said case closure has securing pawls which produce elastic force in a direction to be fitted to said case body, and board-holding portions for positioning and holding the ends of said circuit boards.

2. The device for mounting boards according to claim 1, wherein the board-guide grooves are formed at positions asymmetrical in an up-and-down direction of the case body which is the direction of thickness of the circuit boards.

3. The device for mounting boards according to claim 1, wherein one of said board guide grooves is formed on an inner surface of a back plate of said case body that is positioned on a side opposite to where said case closure is mounted; and wherein the case body has a board-positioning member formed on the inner surface of said back plate so as to intersect said board guide groove formed on the inner surface of the back plate; and wherein said circuit board has an engaging portion at a front end thereof in the direction in which said circuit board is inserted in said case body so as to engage with said board-positioning member.

4. The device for mounting boards according to claim 3, wherein the board-positioning member is disposed at a position asymmetrical in a right-and-left direction of the case body which is the direction of width of the circuit board.

5. The device for mounting boards according to claim 1, wherein one of said board guide grooves is formed on an inner surface of a first side plate of said case body that is positioned on a side adjacent to where said case closure is mounted, and another of said board guide grooves is formed on an inner surface of a second side plate of said case body that is positioned on another side adjacent to where said case closure is mounted and opposite to said first side plate; and wherein the case body has a resilient protuberance formed on the inner surface of the first and second side plates, each protuberance arranged in parallel with a direction of insertion of said circuit board so as to intersect said board guide groove formed on the inner surface of the respective side plate on which said protuberance is formed; and wherein said circuit board has recessed portions to engage with said resilient protuberances, respectively.

6. The device for mounting boards according to claim 5, wherein the resilient protuberances have tapered portions which enable the circuit board to move in the direction of insertion and engaging portions which prevent the circuit board from moving in a direction in which the circuit board is taken out, and the recessed portions in the circuit board have a shape complementary to said resilient protuberances.

7. The device for mounting boards according to claim 5, wherein the resilient protuberances are formed on the first and second side plates on both sides of the case body, respectively, and are arranged at positions asymmetrical in a back-and-forth direction of said case body in which said circuit boards are inserted.

8. A device for mounting a plurality of circuit boards, comprising:
a plurality of circuit boards arranged one on top of the other;
a case body having board guide grooves formed in an inner surface thereof which correspond to said plurality of circuit boards and which accommodate said plurality of circuit boards one on top of the other; and
a case closure secured to an end of said case body in order to position and secure the circuit boards in a housing constituted by said case body and said case closure; and
wherein each of said board guide grooves has a uniform width slightly larger than a thickness of said corresponding circuit board;
wherein each of said guide grooves has a tapered portion at one end with a width expanding in a direction towards an end of said case body which opposes said case closure, opposite to an insertion direction of said respective circuit board; and
wherein said case closure has securing pawls which elastically couple with said case body, and board holding portions for holding and positioning respective ends of said plurality of circuit boards.

9. The device for mounting boards according to claim 8, wherein said plurality of circuit boards are separated away from each other by space-holding members provided between said plurality of circuit boards.

10. The device for mounting boards according to claim 9, wherein said space-holding members are provided nearly at a center at a front end of each circuit board.

11. A device for mounting circuit boards comprising:
a plurality of circuit boards;
a case body having a first side plate, a second side plate opposite said first side plate, and a back plate adjacent said first and second side plates;
a plurality of sets of board guide grooves formed inside said case body, wherein each set of board guide grooves includes a first side groove formed on an inner surface of said first side plate, a second guide groove formed on an inner surface of said second side plate, and a third guide groove formed on an inner surface of said back plate, wherein said each of said plurality of circuit boards is supported in said case body in one of said plurality of sets of board guide grooves after being inserted therein by sliding said respective circuit board in an insertion direction of said case body; and
a case closure secured to an end of said case body, in order to position and secure said plurality circuit boards in said case body; and
wherein each of said first and second board guide grooves has a tapered portion at one end with a width of each tapered portion expanding in a direction towards an end of said case body which opposes said case closure, opposite to the insertion direction of said respective circuit board.

12. The device for mounting circuit boards according to claim 11, wherein said case closure has securing pawls which produce an elastic force to secure said case closure to said case body, and board-holding portions for positioning and holding ends of said circuit boards facings said case closure.

13. The device for mounting circuit boards according to claim 11, wherein each of said sets of board-guide grooves arc formed at positions asymmetrical in the vertical direction of the case body which is in a direction of a thickness of each of said circuit boards.

14. The device for mounting boards according to claim 11, wherein said case body has a board-positioning member formed on the inner surface of said back plate so as to intersect said third board guide groove of each set of board guide grooves, and wherein each circuit board has an engaging portion at a front end thereof that is nearest said back plate so as to engage with said board-positioning member.

15. The device for mounting boards according to claim 14, wherein said board-positioning member is disposed at a position asymmetrical in a right-and-left direction of said case body which is the direction transverse to said insertion direction.

16. The device for mounting boards according to claim 11, wherein said case body has a first resilient protuberance formed in said first guide groove for each set of guide grooves and a second resilient protuberance formed in said second guide groove for each set of guide grooves, and wherein each of said circuit boards has recessed portions to engage with said resilient protuberances, respectively.

17. The device for mounting boards according to claim 16, wherein each of said resilient protuberances has a tapered portion which enables the corresponding circuit board to move in said insertion direction and an engaging portion which prevents the circuit board from moving in a removal direction opposite said insertion direction, and wherein the recessed portions in the circuit boards have a shape complementary to said resilient protuberances.

18. The device for mounting boards according to claim 16, wherein said resilient protuberances for each set of guide grooves are arranged at positions asymmetrical in the insertion direction of said case body.

19. The device for mounting boards according to claim 18, further comprising a space-holding member provided between each two of said plurality of circuit boards that are adjacent to each other in the vertical direction so as to separate said plurality of circuit boards from one another.

20. The device for mounting boards according to claim 19, wherein said space-holding member is provided at a substantial center of a front end of said each two of said plurality of circuit boards.

* * * * *